United States Patent
Andry et al.

(10) Patent No.: US 9,059,161 B2
(45) Date of Patent: Jun. 16, 2015

(54) COMPOSITE WIRING BOARD WITH ELECTRICAL THROUGH CONNECTIONS

(71) Applicant: International Business Machines Corporation, Armonk, NY (US)

(72) Inventors: Paul S. Andry, Yorktown Heights, NY (US); Evan G. Colgan, Chestnut Ridge, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 13/623,873

(22) Filed: Sep. 20, 2012

(65) Prior Publication Data

US 2014/0078704 A1      Mar. 20, 2014

(51) Int. Cl.
| | |
|---|---|
| H05K 1/03 | (2006.01) |
| H05K 1/18 | (2006.01) |
| H05K 1/14 | (2006.01) |
| H05K 1/02 | (2006.01) |
| H01L 23/498 | (2006.01) |
| H01L 23/15 | (2006.01) |

(52) U.S. Cl.
CPC .......... *H01L 23/49827* (2013.01); *H05K 1/18* (2013.01); *H05K 1/14* (2013.01); *H05K 1/0284* (2013.01); *H01L 2224/16225* (2013.01); *H01L 2224/32225* (2013.01); *H01L 2224/73204* (2013.01); *H01L 2924/15311* (2013.01); *H01L 23/15* (2013.01)

(58) Field of Classification Search
CPC ................ H01L 23/538; H01L 2224/16225; H01L 2224/32225; H01L 2224/73204; H01L 2924/15311; H01L 2924/00012; H01L 2924/10253; H01L 23/49827; H01L 2224/97; H01L 21/486; H05K 3/3436; H05K 2201/10378; H05K 2201/10674; H05K 1/0306; H05K 2201/0108; H05K 3/4688
USPC .......... 174/250–268; 361/760; 257/678, 686, 257/778
See application file for complete search history.

(56) References Cited

U.S. PATENT DOCUMENTS

| | | | | |
|---|---|---|---|---|
| 5,656,858 | A | * | 8/1997 | Kondo et al. .................. 257/737 |
| 5,807,783 | A | | 9/1998 | Gaul et al. ..................... 438/406 |
| 6,114,768 | A | | 9/2000 | Gaul et al. ..................... 257/777 |
| 7,576,435 | B2 | * | 8/2009 | Chao .............................. 257/778 |
| 7,723,207 | B2 | | 5/2010 | Alam et al. .................... 438/455 |
| 8,411,459 | B2 | * | 4/2013 | Yu et al. ......................... 361/783 |
| 2008/0284037 | A1 | * | 11/2008 | Andry et al. .................. 257/774 |
| 2010/0084752 | A1 | | 4/2010 | Horning et al. .............. 257/682 |
| 2010/0109142 | A1 | * | 5/2010 | Toh et al. ....................... 257/690 |
| 2011/0019368 | A1 | | 1/2011 | Andry et al. .................. 361/748 |
| 2011/0042820 | A1 | | 2/2011 | Knickerbocker ............. 257/774 |

FOREIGN PATENT DOCUMENTS

WO     WO2006098794     9/2006     ............... H02N 1/00

* cited by examiner

*Primary Examiner* — Ishwarbhai B Patel
(74) *Attorney, Agent, or Firm* — Ido Tuchman; Anne V. Dougherty

(57) ABSTRACT

A composite wiring circuit with electrical through connections and method of manufacturing the same. The composite wiring circuit includes a glass with first electrically-conducting through vias. The first electrically-conducting through vias pass from a top surface of the glass layer to a bottom surface of the glass layer. The composite wiring circuit further includes an interposer layer with second electrically-conducting through vias. The second electrically-conducting through vias pass from a top surface of the interposer layer to a bottom surface of the interposer layer. The second electrically-conducting through vias are electrically coupled to the first electrically-conducting through vias.

13 Claims, 9 Drawing Sheets

COMPOSITE WIRING BOARD WITH ELECTRICAL THROUGH CONNECTIONS

BACKGROUND

This invention relates to integrated circuit carriers, and more particularly to functional glass handler wafer with through vias.

In the packaging of semiconductor chips, typically an organic laminate substrate is used which fans out the fine pitch, typically 0.15 to 0.2 mm, C4 solder bumps on the silicon die to larger pitch, typically 1.0 to 1.2 mm, BGA (ball grid array) or LGA (land grid array) connections. With a BGA, the chip package is attached to a printed circuit board by reflowing the solder balls to form a permanent connection whereas an LGA type interposer provides a connection where the chip package can be readily removed and replaced on the printed circuit board (PCB). The pitch of the C4s limits the amount of input/output signals, i.e., I/O which can be provided to a chip. Note that a significant fraction of the C4s is typically required for power delivery. The minimum C4 pitch between a chip and the package substrate to which it is attached is a function of the chip size and the difference in the thermal coefficient of expansion (TCE) between the chip and the substrate. Thermal cycling results in stresses at the C4 connections between the chip and substrate if the TCE is different. Larger pitch C4s, which are also taller, can relieve a greater strain before failing.

One recently developed approach to increasing the I/O off of a chip is to use a silicon carrier, or interposer, which is placed between the chip and the laminate substrate and provides a space transform between fine pitch microbump connections to the chip with larger pitch C4 connections to the laminate substrate. Since both the chip and carrier are made of silicon, fine pitch microbumps can be used since there is no difference in TCE.

The use and assembly of a conventional silicon carrier may include bonding the silicon wafer using a polymer layer to a glass handler wafer. After dicing, the silicon carrier is then placed on a packaging substrate, which is typically an organic laminate but can also be a multilayer ceramic, such that the C4s are aligned with corresponding pads, and reflowed to form electrical connections through the C4s. The glass handler wafer portion is then removed, typically with a laser release process which ablates/vaporizes the polymer adhesive between the silicon carrier and the glass handler. After appropriate cleaning and surface treatments, the chip or chips are then connected to the silicon carrier using microbumps and an underfill material is applied to both the C4 and the microbump layers and cured. Alternate assembly sequences such as underfilling the Si carrier prior to attaching the chips with microbumps are also possible.

BRIEF SUMMARY

Although there are a number of significant advantages in using silicon carriers, the fabrication process is complicated by the need to attach to a temporary glass handler wafer to allow processing the back side of the carrier. Further, Si carriers are thin (20 to 150 microns) and large ones typically cannot be attached to organic laminate substrates by C4 solder balls due to the thermal coefficient of expansion mismatch stresses and the thin, fragile nature of the silicon carrier.

Accordingly, one example aspect of the present invention is a composite wiring circuit with electrical through connections. The composite wiring circuit includes a glass layer with first electrically-conducting through vias. The first electrically-conducting through vias pass from a top surface of the glass layer to a bottom surface of the glass layer. The composite wiring circuit further includes an interposer layer with second electrically-conducting through vias. The second electrically-conducting through vias pass from a top surface of the interposer layer to a bottom surface of the interposer layer. The second electrically-conducting through vias are electrically coupled to the first electrically-conducting through vias.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
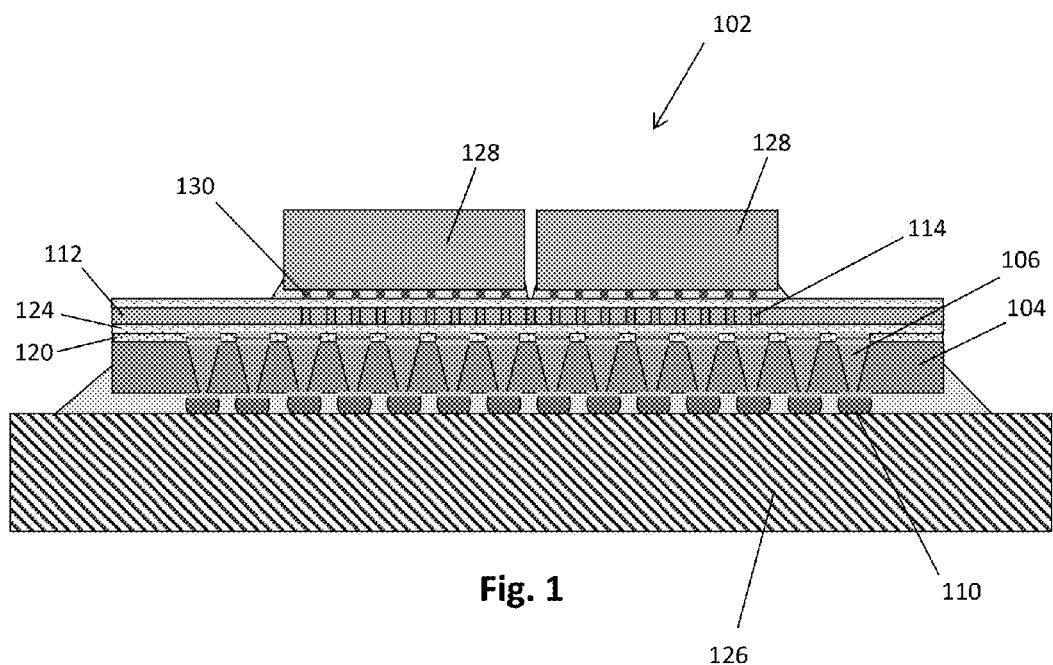
FIG. 1 shows a composite wiring circuit with electrical through connections according to one embodiment of the present invention.

The present invention is described with reference to embodiments of the invention. Throughout the description of the invention reference is made to FIGS. 1-13. When referring to the figures, like structures and elements shown throughout are indicated with like reference numerals.

FIG. 1 shows a composite wiring circuit 102 with electrical through connections according to one embodiment of the present invention. The composite wiring circuit 102 includes a glass layer 104 with first electrically-conducting through vias 106 and an interposer layer 112 with second electrically-conducting through vias 114. In one embodiment, the interposer layer 112 is manufactured from a silicon (Si) wafer using standard silicon wafer processing. The glass layer 104 provides mechanical support to the relatively thin interposer layer 112 while it is being processed on the back side as a wafer.

The silicon interposer contains thru silicon vias (TSVs) 114, redistribution wiring, and is typically larger than the chip or chips 128 and somewhat smaller then the laminate substrate 126. The TSVs 114 and first redistribution wiring 124, are used to form electrical connections between the microbumps 130 on the top surface of the composite wiring circuit and the C4s 110, on the bottom surface of the composite wiring circuit. Silicon carriers, or interposers, can also be used to provide a greater number of input and output (I/O) signals between two or more chips mounted on a common silicon carrier then could be provided with a conventional packaging structure due to the silicon BEOL like line and spacing design rules available on Si carriers and the fine pitch (20 to 150 microns) microbumps.

A number of the fabrication process requirements result in silicon carriers being thin, on the order of 20 to 150 microns thick. In the TSV formation step, typically deep reactive ion etching (DRIE) is used to etch trenches and other features where the aspect ratio is about 10:1 or less and it is desirable to limit the width of metal filled features in one dimension to about four to eight microns to minimize stress during subsequent processing.

The first electrically-conducting through vias 106 in the glass layer 104 pass from a top surface of the glass layer to a bottom surface of the glass layer. In one embodiment, the first electrically-conducting through vias 106 terminate at C4 solder bumps 110. The first electrically-conducting through vias may be formed, for example, by grit blasting in conjunction with a masking material. In one embodiment, the through vias are filled with copper.

The second electrically-conducting through vias 114 in the interposer layer 112 pass from a top surface of the interposer layer to a bottom surface of the interposer layer. Furthermore, the second electrically-conducting through vias 114 are electrically coupled to the first electrically-conducting through vias 106 by the first redistribution wiring (RDL) 124 located on the top surface of the Si carrier 112. Both the first electrically-conducting through vias 106 and second electrically-conducting through vias 114 may be filled, for example, with copper. Note that when the composite wiring circuit 102 is formed by bonding together the glass handler wafer and the silicon interposer wafer, they are joined face to face, or top surface to top surface as will be explained in FIGS. 6-13. Therefore, the top surface of the composite wiring circuit 102 corresponds to the bottom of the interposer and the bottom of the composite wiring circuit 102 corresponds to the bottom of the glass handler.

The composite wiring circuit 102 may further include an underfill layer 120 such as an "OBAR" (over-bump applied resin) wafer-level underfill material which is applied to the wafer from which the interposer 112 is formed prior to attachment to the glass layer 104. The underfill layer 120 is positioned between the interposer layer 112 and the glass layer 104. In conjunction with the electrical coupling means between the interposer layer 112 and the glass layer 104 the underfill layer 120 joins the top surface of the interposer layer and the top surface of the glass layer.

Figure 2:
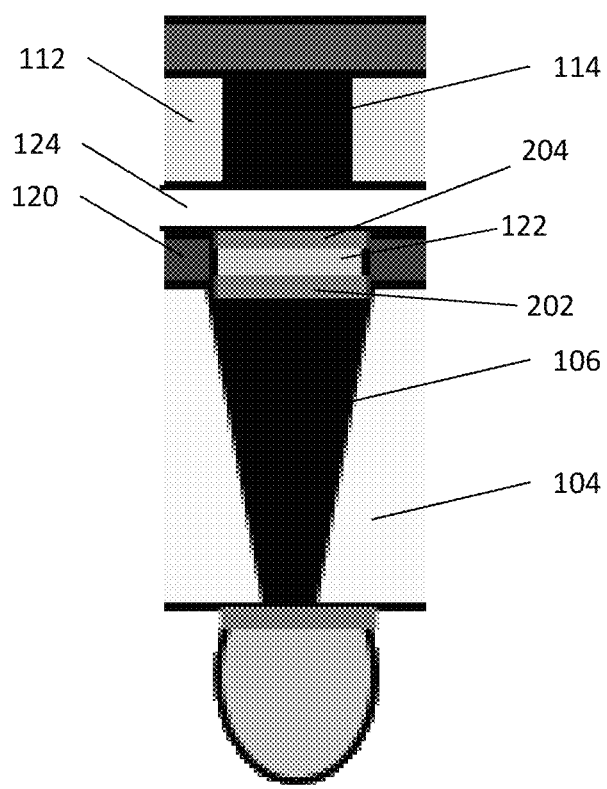
FIG. 2 shows one embodiment of the present invention where the glass layer and the interposer layer are electrically coupled together by a first coupling layer.

FIG. 2 shows one embodiment of the present invention where the glass layer 104 and the interposer layer 112 are electrically coupled together by a first coupling layer 122 (also referred to herein as solder layers). In this embodiment, the first coupling layer 122 may be between the top surface of the first electrically-conducting through via 106 and the bottom surface of the second electrically-conducting through via 114. Note that a variety of low-profile metallurgical join means are possible, and though described as solder are not intended to be limited to solder but could also include intermetallic phase formation, Gold-Gold or Copper-Copper thermocompression bonding, Au—Sn alloy bonding, etc. . . .

In one embodiment of the invention, the first electrically-conducting through vias 106 have a first diffusion barrier 202. The first diffusion barrier 202 is carried by a top surface of the first electrically-conducting through vias 106. The second electrically-conducting through vias 114 are connected through redistribution wiring layers 124 to a second diffusion barrier 204 which is carried by a bottom surface of the first redistribution wiring layers 124.

The first diffusion barrier 202 is electrically coupled to the top surface of the first electrically-conducting through vias 106. The first coupling layer 122 is electrically coupled to a top surface of the first diffusion barrier 202 and a bottom surface of the second diffusion barrier 204.

The bottom surface of the second diffusion barrier 204 is further electrically coupled to the bottom surface of the second electrically-conducting through vias 114 through the redistribution wiring layers 124. In one embodiment of the invention, the first diffusion barrier 202 and the second diffusion barrier 204 may include ball limiting metallurgy pads and are formed of materials which are "wetted" by solder and serve to reduce or prevent undesired reactions between the metallurgy of the through vias or redistribution wiring layers and the solder or other material used for electrical connections between the glass handler wafer and silicon interposer.

Figure 3:
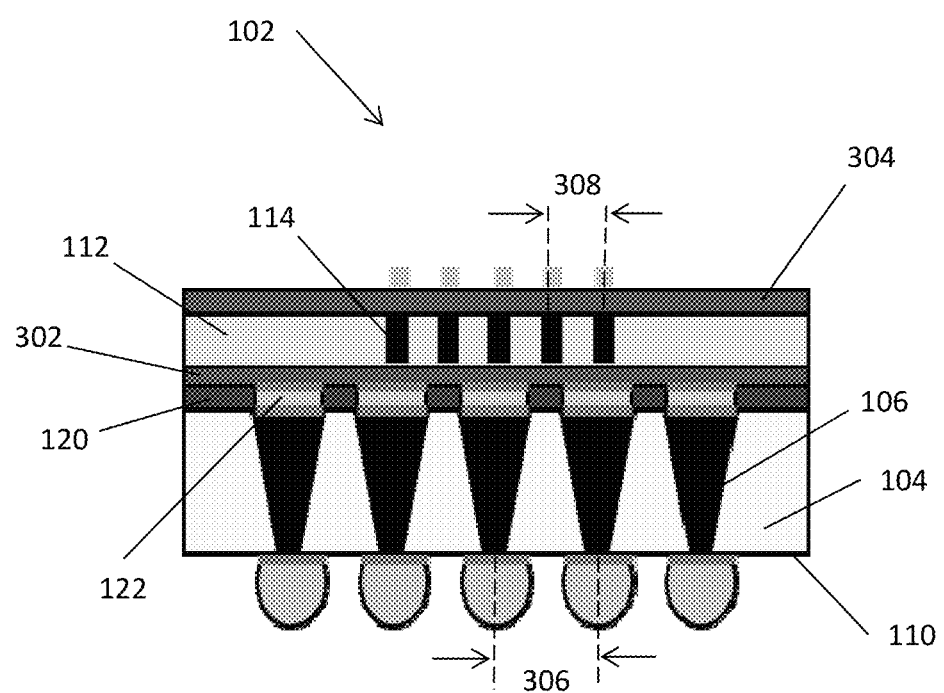
FIG. 3 shows one embodiment of the present invention where the composite wiring circuit includes a first redistribution wiring layer.

FIG. 3 shows one embodiment of the present invention where the composite wiring circuit 102 includes a first redistribution wiring layer 302. The first redistribution wiring layer 302 can be carried by the top surface of the silicon interposer layer 112, which as described faces the glass handler after assembly. The first redistribution wiring layer 302 electrically couples the first electrically-conducting through vias 106 and the second electrically-conducting through vias 114 together using coupling layer 122. In one embodiment of the invention, the composite wiring circuit 102 includes a second redistribution wiring layer 304 which is carried by the bottom surface of the interposer layer 112, which is located on the top surface of the composite wiring circuit after assembly and processing of the interposer and handler wafers.

As shown in FIG. 3, the first electrically-conducting through vias 106 can have a different pitch than the second electrically-conducting through vias 114. In one embodiment of the invention, the first electrically-conducting through vias 106 have a first pitch 306 while the second electrically-conducting through vias 114 have a second pitch 308. The first pitch 306 may be larger than the second pitch 308. To minimize stress and improve yield, it is desirable for the pitch of the coupling joins between the glass handler wafer and the silicon interposer wafer to be as large as possible. This can be best achieved by locating the first redistribution wiring layers on the top surface of the silicon interposer so that the pitch of the solder joins can be increased and the RDL processing can occur on the wafer prior to thinning.

Figure 4:
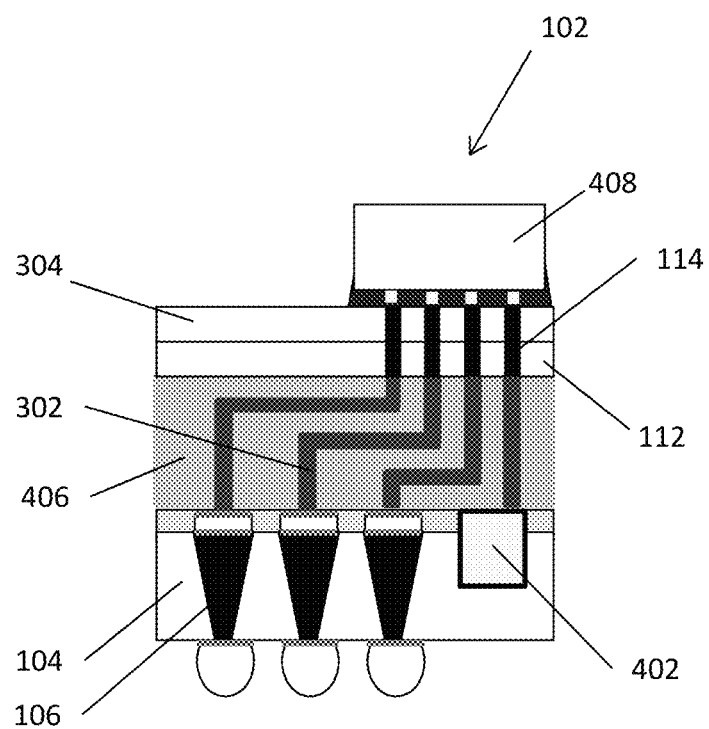
FIG. 4 shows an embodiment of the present invention where the composite wiring circuit further includes a passive electrical device.

FIG. 4 shows an embodiment of the present invention where the composite wiring circuit 102 further includes a passive electrical device 402. The passive electrical device 402 is carried by the glass layer 104. The passive electrical device 402 can be electrically coupled to one or more of the electrically-conducting through vias 106 or 114. In one embodiment, the passive electrical device 402 is an inductor.

An embodiment of the invention may include a composite wiring circuit 102 with multiple first redistribution wiring layers 302. Within the plurality of first redistribution wiring layers 302, at least one of the first redistribution wiring layers 302 is electrically coupled to at least one of the first electrically-conducting through vias 106 and at least one of the second electrically-conducting through vias 114. The embodiment may further include a dielectric layer 406. The dielectric layer 406 is used to electrically insulate each first redistribution wiring layer 302 among the plurality of first redistribution wiring layers.

One embodiment of the invention includes a composite wiring circuit 102 with a second redistribution wiring layer 304. The second redistribution wiring layer 304 is electrically coupled to an integrated circuit 408 that is carried by the second redistribution wiring layer 304 that is located on the top surface of the composite wiring circuit, or the bottom of the interposer layer 112. In one embodiment of the invention, the integrated circuit 408 is electrically coupled to at least one of the second electrically-conducting through vias 114 through the second redistribution wiring layer 304.

Figure 5:
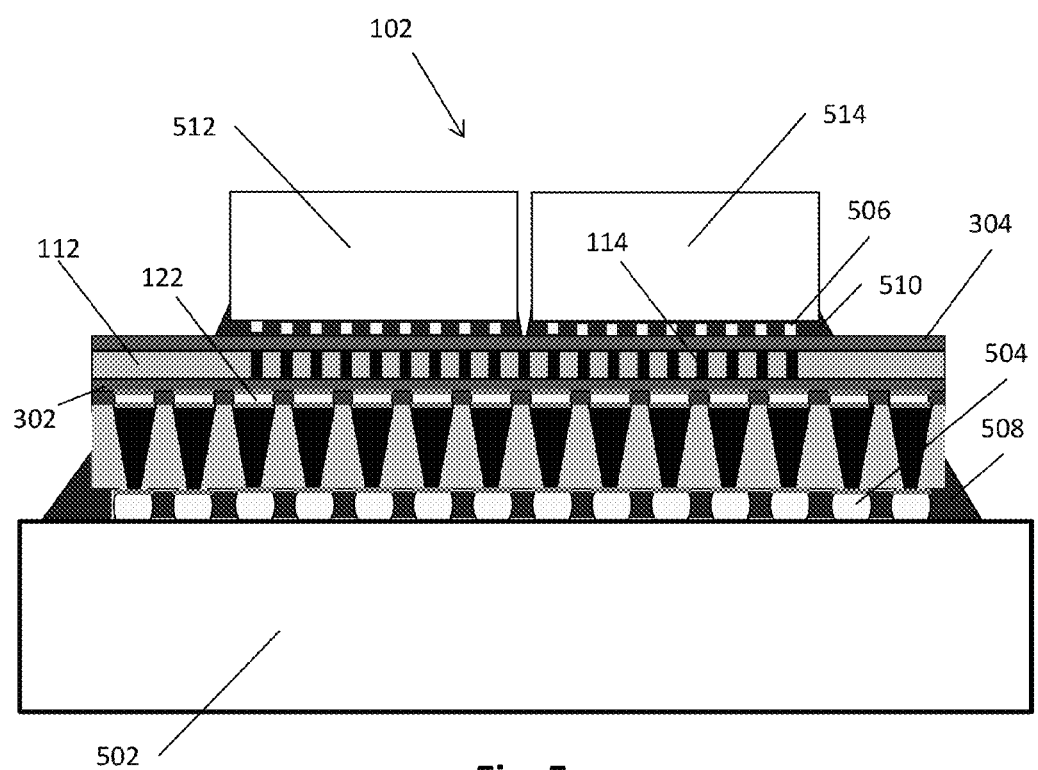
FIG. 5 shows an embodiment of the present invention where the composite wiring circuit is attached to a laminate substrate.

FIG. 5 shows an embodiment of the present invention where the composite wiring circuit 102 is carried by a laminate substrate 502. The laminate substrate may be core or coreless, organic or ceramic, and may contain multiple layers (core and buildup layers). In one embodiment, the composite wiring circuit 102 can also include a second coupling layer 504. The second coupling layer 504 may electrically couple the composite wiring circuit 102 and the laminate substrate 502 together. For example, the second coupling layer 504 is reflowed to pads provided on the substrate 502. In another embodiment, the composite wiring circuit 102 can further include a second underfill layer 508. The second underfill layer 508 and second coupling layer 504 joins the composite wiring circuit 102 and the laminate substrate 502.

In one embodiment of the invention the composite wiring circuit 102 includes a second redistribution wiring layer 304 and one or more integrated circuit chips. The second redistribution wiring layer 304 electrically couples to an integrated circuit and at least one of the second electrically-conducting through vias 114. The composite wiring circuit 102 may further include a third coupling layer 506. This third coupling layer 506 is electrically coupled to an integrated circuit chip and to the second electrically-conducting through vias 114 either directly if there is no second redistribution wiring layer 304, or through the second redistribution wiring layer 304 if one is present. The composite wiring circuit 102 may further include a third underfill layer 510 used to join the integrated circuit with the interposer layer and protect the solder joints.

In one embodiment of the invention, the composite wiring circuit 102 includes a first integrated circuit 512 and a second integrated circuit 514. Both integrated circuits 512 and 514 may be carried by the interposer layer 112. The second redistribution wiring layer 304 on the interposer layer 112 may be used to electrically couple the first integrated circuit 512 and the second integrated circuit 514.

Figure 6:
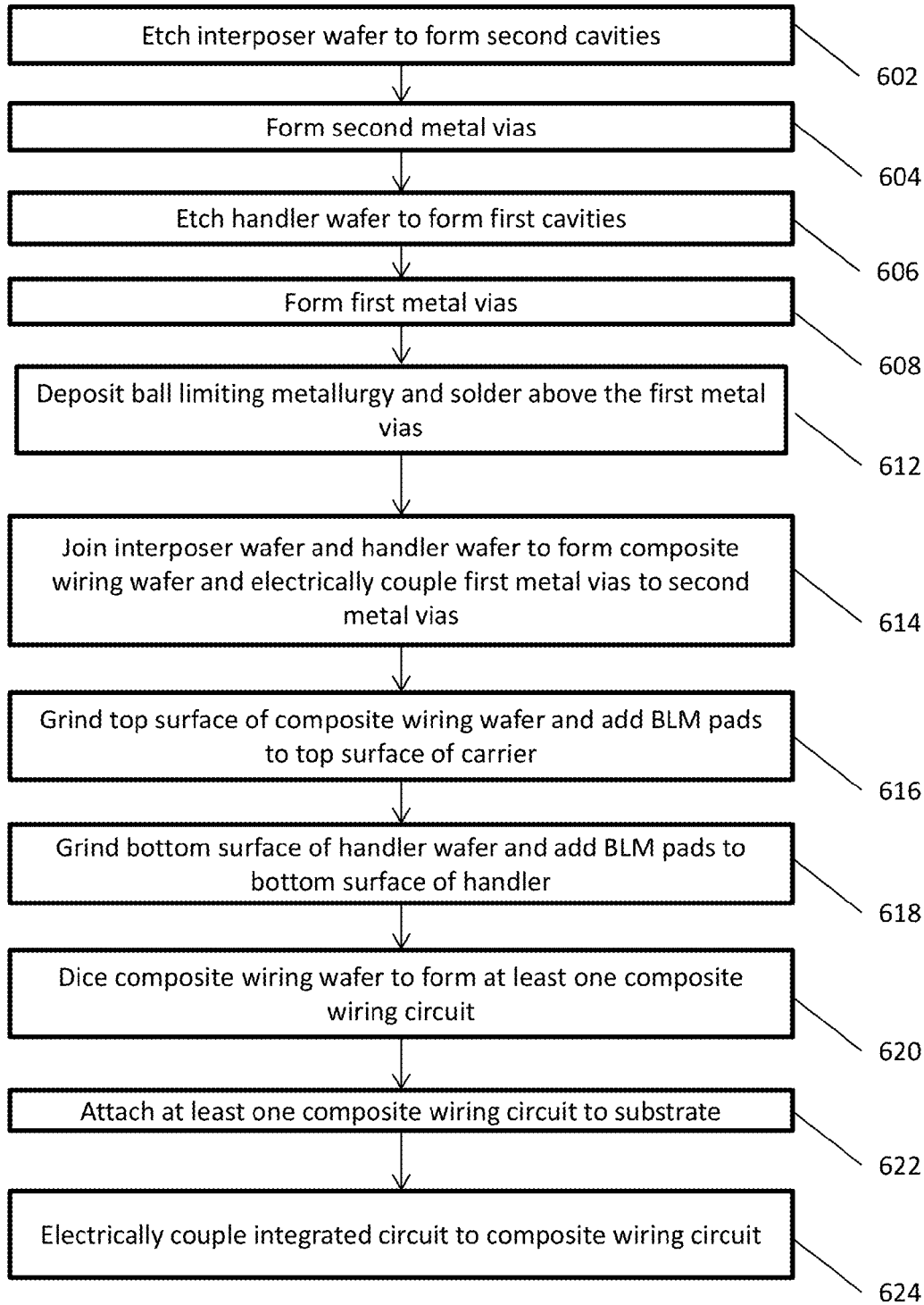
FIG. 6 shows a method for forming a composite wiring circuit in accordance with one embodiment of the present invention.

FIG. 6 shows a method for forming a composite wiring circuit in accordance with one embodiment of the present invention. The method includes etching step 602. During etching step 602, the top surface of an interposer wafer (also referred to herein as a silicon wafer) is etched to form the second cavities. In one embodiment, the etched cavities are blind vias that do not extend through the bottom of the interposer wafer. The cavities may be etched using DRIE into the wafer in the locations where TSVs are desired. The wafer is then thermally oxidized to create an electrical insulating layer on all surfaces of the cavities. After etching step 602 is completed, the method continues to forming step 604.

Figure 7:
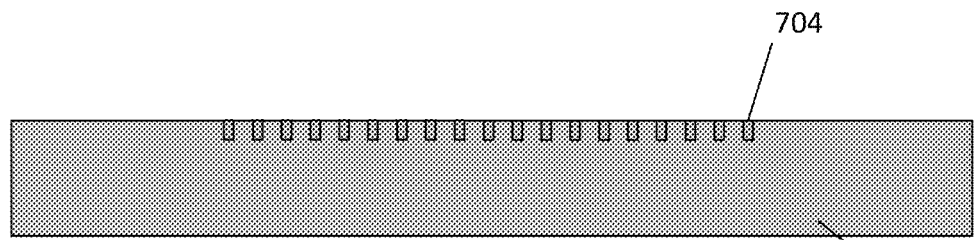
FIG. 7 shows an interposer wafer with second metal vias formed thereon in accordance with one embodiment of the present invention.

At forming step 604, the second metal vias are formed in the second cavities of the interposer wafer. FIG. 7 shows an interposer wafer 702 with second metal vias 704 formed thereon. For example, the cavities may be filled with a metal, typically tungsten or copper, and chemical mechanical polishing is used to remove the overburden, i.e., excess metal on the wafer surface between the cavities. Redistribution wiring, using typical silicon wafer back end of line (BEOL) processing, can be formed connecting to, and above, the metal filled cavities. If desired, multiple redistribution wiring levels could be build on the wafer where appropriate silicon oxide and silicon nitride layers are used to protect the copper lines. The final metal layer formed consists of ball limiting metallurgy (BLM) pads, to which microsolder bumps can subsequently attached (see FIG. 3). These typically have a thin layer of Au to provide a surface which can be soldered to and are patterned to match the solder patterns of the glass handler wafer which will subsequently be attached. After forming step 604 is completed, the process continues to etching step 606.

Figure 8:
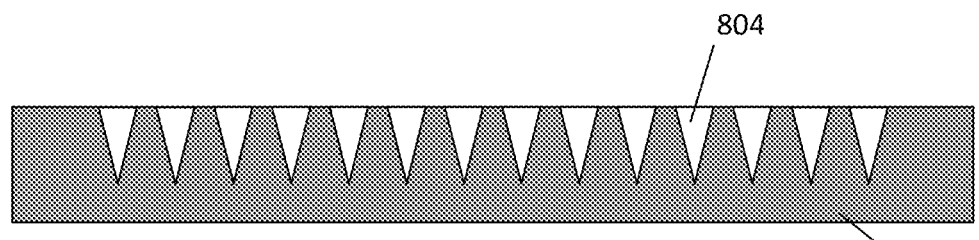
FIG. 8 shows a handler wafer with etched cavities in accordance with one embodiment of the present invention.

At etching step 606, the top surface of the handler wafer (also referred to herein as a glass wafer or glass handler wafer) is etched to form first cavities in the handler wafer. FIG. 8 shows a handler wafer 802 with etched cavities 804. The handler wafer may be approximately the same thickness as the starting silicon wafer (~0.75 mm thick) and is circular in shape with the same nominal diameter as the silicon wafer which is laminated to it.

Those skilled in the art will understand that forming vias in the interposer and handler wafers can be performed simultaneously or in a different order. Thus, the sequence discussed above should not be considered to limit the scope of the claimed invention.

In one embodiment, the etched cavities are blind vias that do not extend through the bottom of the handler wafer. There are a number of possible methods of etching holes in glass wafers which include, but are not limited to, grit blasting with a mask, dry etching with a mask, wet etching with a mask, mechanical drilling, laser drilling, laser or UV exposure enhanced glass etching, microwater jet etching, hot embossing, acoustic agitation enhanced wet etching or laser induced backside wet etching.

In one embodiment, grit blasting is performed where a dry film resist is used to define the area to be etched. With such a process, the sidewall angle is about 15 degrees and 2:1 or 3:1 aspect ratio hole is possible. For examples, the holes could be on a 300-400 micron pitch with a top diameter of about 200 microns and a depth of about 500 microns. The blind holes may be tapered, but with some of the other hole fabrication methods the sidewalls would be vertical or near vertical. A wet etch step can then be performed to removed the glass damaged zone in the recesses and either a thin compressive layer such as low pressure chemical vapor deposition (LPCVD) silicon nitride or chemical/thermal treatments would be performed to create a compressive layer to strengthen the glass. Once etching step 606 is completed, the method continues to forming step 608.

At forming step 608, the first metal vias are formed in the first cavities of the handler wafer to metalize the handler (glass) wafer. The forming step may include depositing a blanket barrier/seed layer such as Ta, Ta(N) or Cu by sputtering, and then plating up copper to fill the blind cavities. At this point, the excess copper could be removed by chemical mechanical polishing (CMP), or with a lithography step, it could be wet etched to form a layer of redistribution wiring (RDL). An alternate process would be to apply a photolithographic mask after barrier/seed layer deposition, and plate-up to fill the blind cavities and optionally form lines at the same time. In one embodiment the first metal vias are filled with copper. The copper lines are then planarized with an insulating material.

Figure 9:
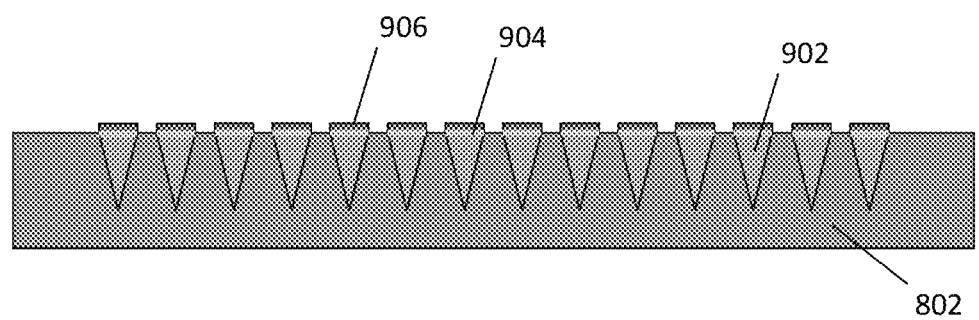
FIG. 9 shows a handler wafer with first metal vias and ball limiting metallurgy pads and a coupling layer in accordance with one embodiment of the present invention.

At step 612 ball limiting metallurgy and solder for joining are deposited above the first metal vias. FIG. 9 shows the handler wafer 802 with the first metal vias 902 and the ball limiting metallurgy layer 904 and the solder layer 906 for joining. If redistribution wiring layers are present, after opening a final via in the passivation layers, the ball limiting metallurgy, such as Ni/Au, layers are deposited by using a shadow mask, or by sputtering a seed layer, photolithographic masking, plating, and then removing the seed layer from the field areas. If solder for joining is needed, it can either be plated after the BLM layers, or subsequently deposited by injection molded solder or other similar techniques.

It is noted that the pitch of the recessed cavities in the glass is intermediate in size between the chip area array connections and the package to board BGA or LGA connections and that the bumps, solder joints, or other electrical joining method between the functional glass handler wafer and the silicon carrier wafer are the same pitch if there is no RDL on the functional glass handler wafer, or close to the same pitch if there is one or more redistribution layers on the functional glass handler wafer. If a solder bump, or ball, type connection is used between the two wafers, they could be fabricated on either wafer. In this case, it is assumed that the solder bumps are fabricated on the function glass handler wafer.

It should be appreciated that processing of the handler and interposer wafers as described above may be performed simultaneously or in reverse order without departing from the spirit and scope of the invention. In an optional design variation, the steps used to fabricate the metal filled recesses and/or redistribution wiring layers on the glass substrate can be used to build passive electrical devices such as inductors which are difficult to integrate into silicon wafers. Once step 612 is completed, the method continues to joining step 614.

Figure 10:
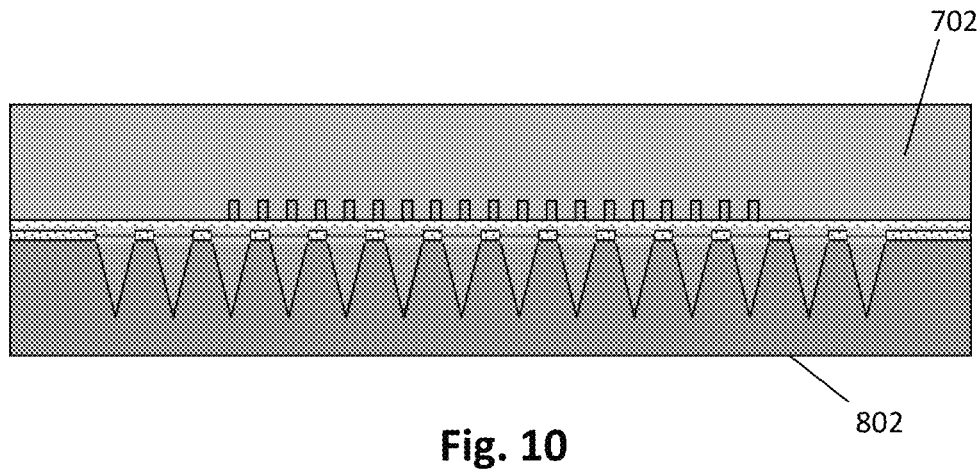
FIG. 10 illustrates a handler wafer bonded to an interposer wafer in accordance with one embodiment of the present invention.

At joining step 614, the first metal vias are electrically coupled to the second vias. Electrical coupling of the first metal vias to the second metal vias includes electrically connecting the first metal vias to the second metal vias through the first redistribution wiring layer. This step may also include bonding the handler wafer to the interposer wafer. FIG. 10 illustrates the handler wafer 802 bonded to the interposer wafer 702. Note that they are bonded face to face, or top surface to top surface.

Prior to joining together the two wafers, an "OBAR" (over-bump applied resin) wafer-level underfill material may be applied to the wafer with the bumps. The wafers are then aligned so that the bumps, solder joints, or other electrical joining means are aligned between the top surface of the functional glass handler wafer which contains the metal filled recesses and the matching BLM pads on the top surface of the silicon carrier/interposer wafer which contains the metal filled recesses and heat and pressure applied to form electrical connections between them and cure the OBAR material. Note that this is a wafer to wafer bonding process with a full thickness silicon carrier to a glass wafer where the blind holes, or metal filled recesses, are towards the center of the structure on both wafers.

After joining step 614 is completed, the top surface of the interposer wafer is joined with the top surface of the handler wafer to form a composite wiring wafer. The process then continues to grinding step 616.

At grinding step 616, the top surface of the composite wiring wafer is ground such that the second metal vias are exposed at the top surface of the composite wiring wafer. This step may include grinding/polishing the back side of the silicon wafer to expose the metal filled recesses. A combination of RIE and polishing may be used to expose the metal filled cavities which will become the TSVs. After planarization, a selective dry etch is used to recess the silicon, an insulating film is deposited, and then chemical-mechanical polishing is used to remove the insulator from the top surface of the TSVs. Furthermore, BLM microbumps bonding pads may be formed on the back side of the thinned silicon wafer aligned with the TSVs.

Figure 11:
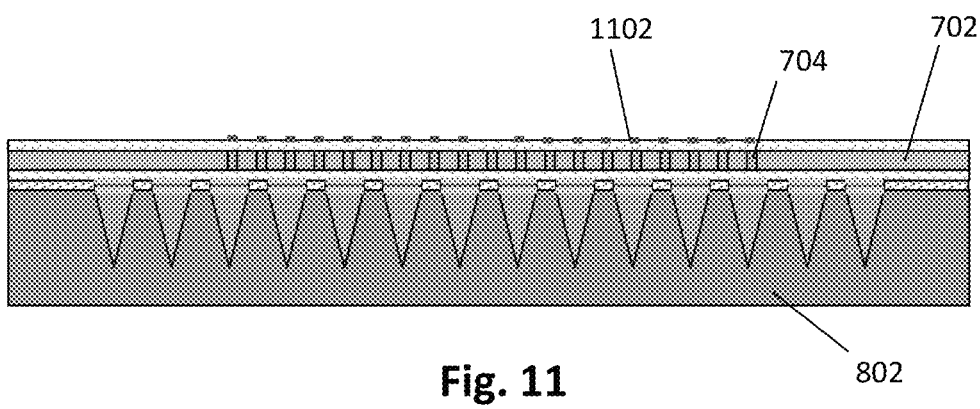
FIG. 11 shows a thinned silicon wafer assembled to a handler wafer with vias electrically coupled to microbumps in accordance with one embodiment of the present invention.

Additional redistribution layers may be formed if desired using BEOL type processes on the back of the thinned silicon wafer prior to building the BLM pads. FIG. 11 shows the thinned silicon wafer 702 with the vias 704 electrically coupled to microbump BLM pads 1102. At this point, an optional protection layer such as polyimide may be deposited over the BLM pads to protect them during subsequent processing. After grinding step 616 is completed, the method proceeds to grinding step 618.

Figure 12:
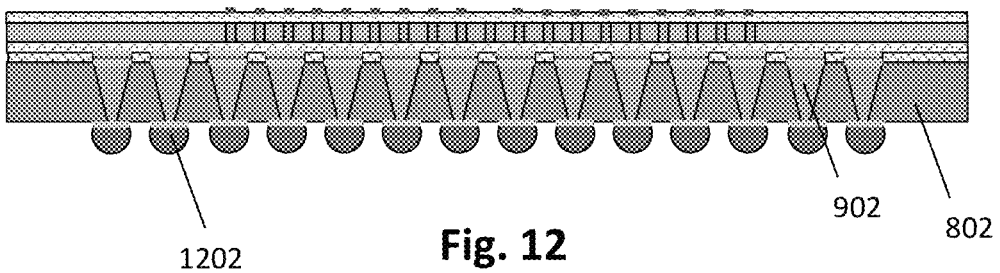
FIG. 12 shows a handler wafer with attached thinned silicon wafer after grinding with the exposed second metal vias electrically coupled to solder balls in accordance with one embodiment of the present invention.

At grinding step 618, the handler wafer is ground such that the first metal vias are exposed at the bottom surface of the handler wafer. The bottom surface of the handler wafer corresponds to the bottom surface of the composite wiring wafer. This step may include grinding and/or polishing the back side of the glass wafer to expose the metal filled recesses, and then depositing the BLM metal stack and solder bumps for joining to the packaging substrate. FIG. 12 shows the handler wafer 802 after grinding with the exposed first metal vias 902 electrically coupled to solder balls 1202. After grinding step 618 is completed, the process continues to dicing step 620.

At dicing step 620, the composite wiring wafer is diced to form at least one composite wiring circuit. The composite wiring circuit includes a handler layer and an interposer layer.

Figure 13:
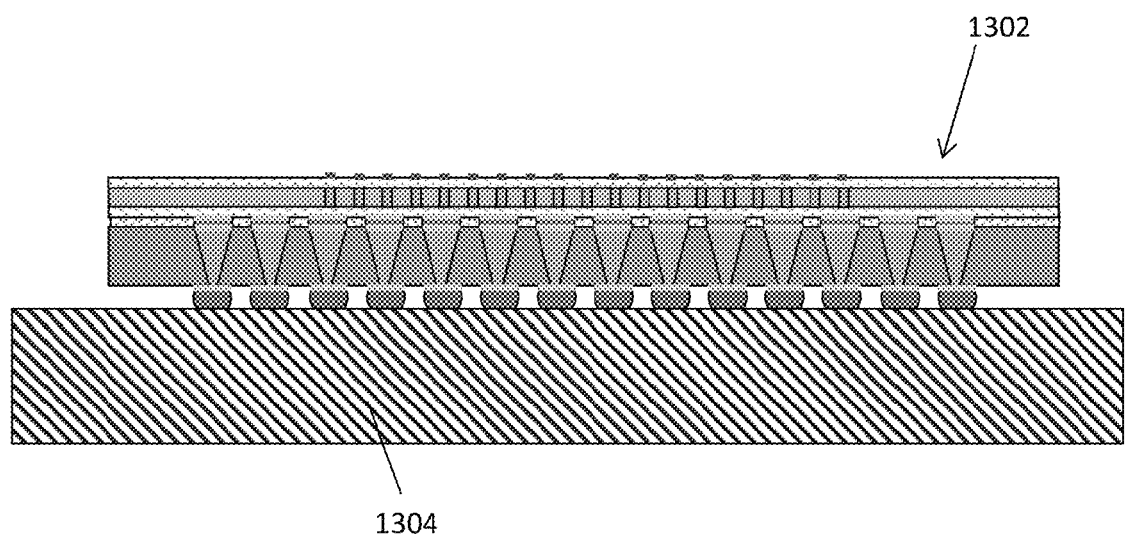
FIG. 13 shows a composite wiring circuit attached to a packaging substrate in accordance with one embodiment of the present invention.

After dicing step 620 is completed, the method continues to attaching step 622. Next, in step 622 the composite wiring circuit is aligned and placed on the packaging substrate such that the corresponding bump, or solder balls, are aligned to the correct pads, and then reflowed to form electrical connections. FIG. 13 shows the composite wiring circuit 1302 attached to a packaging substrate 1304. After attaching step 622 is performed, the method proceeds to coupling step 624. The wiring circuit 1302 would then be underfilled and any protective layer on the silicon carrier is then removed and after appropriate cleaning and surface treatments, the chip or chips are aligned, placed, reflowed, and underfilled.

At coupling step 624, the attached integrated circuit is electrically coupled to the composite wiring circuit. As mentioned above, the integrated circuit and the composite wiring circuit may be electrically coupled through a second redistribution wiring layer. The completed structure is shown in FIG. 1.

By replacing the temporary glass handler wafer with a glass wafer containing conductive thru vias, the final thickness and stiffness of the composite glass and Si carrier can be increased. In addition, the solder bump pitch or height to the laminate substrate can be increased. This reduces the stress and thick metal can be used to fabricate inductors in the glass.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A composite wiring circuit with electrical through connections, the composite wiring circuit comprising:
   a glass layer with first electrically-conducting through vias, the first electrically-conducting through vias passing from a top surface of the glass layer to a bottom surface of the glass layer, the first electrically-conducting through vias including a first pitch;
   an interposer layer with second electrically-conducting through vias, the second electrically-conducting through vias passing from a top surface of the interposer layer to a bottom surface of the interposer layer, the second electrically-conducting through vias including a second pitch that is smaller than the first pitch;
   a first redistribution wiring layer carried by the top surface of the interposer layer which faces the glass layer, the first redistribution wiring layer electrically coupling the first electrically-conducting through vias and the second electrically-conducting through vias; and
   a first coupling layer, wherein the first coupling layer electrically couples a top surface of first electrically-conducting through vias and a bottom surface of the second electrically-conducting through vias;
   wherein the first electrically-conducting through vias include a first diffusion barrier carried by the top surface of the first electrically-conducting through vias, the first diffusion barrier is electrically coupled to the top surface of the first electrically-conducting through vias, and the first coupling layer is electrically coupled to a top surface of the first diffusion barrier;
   wherein the second electrically-conducting through vias include a second diffusion barrier carried by the bottom surface of the second electrically-conducting through vias, the first coupling layer is electrically coupled to a bottom surface of the second diffusion barrier, and the bottom surface of the second diffusion barrier is electrically coupled to the bottom surface of the second electrically-conducting through vias; and
   wherein the first diffusion barrier and the second diffusion barrier include ball limiting metallurgy pads.

2. The composite wiring circuit according to claim 1, further comprising a plurality of first redistribution wiring layers including the first redistribution wiring layer, wherein at least one of the first redistribution wiring layers is electrically coupled to at least one of the first electrically-conducting through vias and at least one of the second electrically-conducting through vias.

3. The composite wiring circuit according to claim 2, further comprising a dielectric layer, the dielectric layer electrically insulating each first redistribution wiring layer.

4. The composite wiring circuit according to claim 1, further comprising a second redistribution wiring layer carried by the bottom surface of the interposer layer which faces away from the glass layer, the second redistribution wiring layer electrically coupled to an integrated circuit carried by the top surface of the interposer layer.

5. The composite wiring circuit according to claim 4, wherein the integrated circuit is electrically coupled to at least one of the second electrically-conducting through vias.

6. The composite wiring circuit according to claim 1, further comprising a first underfill layer, the first underfill layer joining the top surface of the interposer layer which faces the glass layer and the top surface of the glass layer.

7. The composite wiring circuit according to claim 1, further comprising a laminate substrate, wherein the composite wiring circuit is carried by the laminate substrate.

8. The composite wiring circuit according to claim 7, further comprising a second coupling layer, the second coupling layer electrically coupling the composite wiring circuit and the laminate substrate.

9. The composite wiring circuit according to claim 7, further comprising a second underfill layer, the second underfill layer joining the composite wiring circuit and the laminate substrate.

10. The composite wiring circuit according to claim 1, further comprising:
    a first-integrated-circuit carried by the interposer layer; and
    a second-integrated-circuit carried by the interposer layer, wherein the interposer layer electrically couples the first-integrated circuit and the second-integrated-circuit.

11. The composite wiring circuit according to claim 1, further comprising a passive electrical device carried by the glass layer, the passive electrical device is electrically coupled to at least one electrically-conducting through via.

12. The composite wiring circuit according to claim 11, wherein the passive electrical device includes an inductor.

13. The composite wiring circuit according to claim 1, wherein the first electrically-conducting through vias are tapered.

* * * * *